United States Patent
Wu et al.

(10) Patent No.: US 12,307,040 B2
(45) Date of Patent: May 20, 2025

(54) TOUCH DISPLAY SUBSTRATE, INTEGRATED CIRCUIT CHIP AND DISPLAY DEVICE

(71) Applicants: Chongqing BOE Optoelectronics Technology Co., Ltd., Chongqing (CN); BOE Technology Group Co., Ltd., Beijing (CN)

(72) Inventors: Zhongshan Wu, Beijing (CN); Xiaoyuan Wang, Beijing (CN); Jiandong Guo, Beijing (CN); Yan Liu, Beijing (CN)

(73) Assignees: Chongqing Boe Optoelectronics Technology Co., Ltd., Chongqing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/024,019

(22) PCT Filed: May 23, 2022

(86) PCT No.: PCT/CN2022/094424
§ 371 (c)(1),
(2) Date: Feb. 28, 2023

(87) PCT Pub. No.: WO2023/225784
PCT Pub. Date: Nov. 30, 2023

(65) Prior Publication Data
US 2024/0281089 A1 Aug. 22, 2024

(51) Int. Cl.
*G06F 3/041* (2006.01)
*G02F 1/1345* (2006.01)
(Continued)

(52) U.S. Cl.
CPC ...... *G06F 3/04164* (2019.05); *G02F 1/13458* (2013.01); *G06F 3/0412* (2013.01);
(Continued)

(58) Field of Classification Search
CPC .............. G09G 3/32; G09G 2320/0233; H01L 25/0753; H01L 27/156; H01L 33/62
See application file for complete search history.

(56) References Cited

U.S. PATENT DOCUMENTS

2011/0169759 A1* 7/2011 Wang ...................... G06F 3/041
345/173
2023/0176691 A1* 6/2023 Wei ........................ G06F 3/0446
345/173

FOREIGN PATENT DOCUMENTS

| CN | 110187797 A | * | 8/2019 | ........... G06F 3/0412 |
| CN | 112684945 A | * | 4/2021 | ........... G06F 3/0412 |
| CN | 215895423 U | * | 2/2022 | ........... G06F 3/0412 |

OTHER PUBLICATIONS

Dong et al., Machine Translation of Foreign Patent Document CN 110187797A, Touch display panel, Aug. 30, 2019, pp. 1-25 (Year: 2019).*

(Continued)

*Primary Examiner* — Amr A Awad
*Assistant Examiner* — Maheen I Javed
(74) *Attorney, Agent, or Firm* — IPro, PLLC

(57) ABSTRACT

A touch display substrate, an integrated circuit chip and a display device are disclosed. The touch display substrate with an active area and a lead area arranged in sequence includes: a plurality of touch lines arranged in the active area; a plurality of touch leads in one-to-one correspondence with the plurality of touch lines; a plurality of touch electrodes arranged in an array in the active area, each of the touch electrodes is coupled to one of the touch lines; at least (Continued)

two of every three adjacent touch electrodes are connected to different multiplexers through coupled touch lines and touch leads.

18 Claims, 13 Drawing Sheets

(51) Int. Cl.
*G06F 3/044* (2006.01)
*H01L 23/00* (2006.01)
*H10D 86/40* (2025.01)
*H10D 86/60* (2025.01)

(52) U.S. Cl.
CPC ............ *G06F 3/0446* (2019.05); *H01L 24/05* (2013.01); *H10D 86/443* (2025.01); *H10D 86/60* (2025.01)

(56) References Cited

OTHER PUBLICATIONS

Ye et al., Machine Translation of Foreign Patent Document CN 112684945 A, Display panel, touch test method and electronic equipment, Apr. 20, 2021, pp. 1-23 (Year: 2021).*

Chen et al., Machine Translation of Foreign Patent Document CN215895423 U, OLED touch display chip and OLED touch display device comprising same, Feb. 22, 2022, pp. 1-44 (Year: 2022).*

\* cited by examiner

TOUCH DISPLAY SUBSTRATE, INTEGRATED CIRCUIT CHIP AND DISPLAY DEVICE

This application is a National Stage of International Application No. PCT/CN2022/094424, filed on May 23, 2022, which is hereby incorporated by reference in its entirety.

FIELD

The disclosure relates to the field of display technology, and particularly to a touch display substrate, an integrated circuit chip and a display device.

BACKGROUND

The touch display product with display function, such as a display screen of a human-computer interaction device such as a mobile phone or a tablet computer, generally includes two functions: display and touch.

When a user performs a touch operation on the touch display product, the larger the contact area between the user's finger and the touch display product, the greater the amount of data that the touch display product needs to process, so that the calculation efficiency of the touch display product is relatively low.

SUMMARY

Embodiments of the disclosure provide a touch display substrate, an integrated circuit chip and a display device, to solve the above-mentioned problem in related art.

In a first aspect, in order to solve the above-mentioned technical problem, an embodiment of the disclosure provides a touch display substrate with an active area and a lead area arranged in sequence, including: a plurality of touch lines arranged in the active area; a plurality of touch leads, each of the touch leads is electrically connected to at least one touch line: a plurality of touch electrodes arranged in an array in the active area, each of the touch electrodes is coupled to at least one touch line; where at least two of every three adjacent touch electrodes are connected to different multiplexers through coupled touch lines and touch leads.

In a possible embodiment, the touch display substrate is connected with a touch and display driver integration chip, and the multiplexers are located in the touch and display driver integration chip, or the multiplexers are located on the touch display substrate.

In a possible embodiment, the touch display substrate further includes a plurality of data lines arranged in the active area, and a plurality of data leads arranged in the lead area; and the touch substrate further includes a bonding area located on a side of the lead area away from the active area and including at least one chip area, the chip area includes: a plurality of first bonding pins arranged in rows and columns and divided into: display bonding pins coupled to the data lines through the data leads, and touch bonding pins coupled to the touch lines through the touch leads; where the touch bonding pins and the display bonding pins are mixedly arranged in each row of the first bonding pins: in each column of the first bonding pins, the first bonding pins are sequentially offset by a set distance in a row direction, and the first bonding pins in a same column are all the display bonding pins or the touch bonding pins.

In a possible embodiment, in each row of the first bonding pins, a quantity of the display bonding pins is greater than a quantity of the touch bonding pins, and at least one display bonding pin is arranged between two adjacent touch bonding pins.

In a possible embodiment, each row of the first bonding pins includes a plurality of repeating groups arranged circularly, and a quantity ratio of the display bonding pins to the touch bonding pins in one repeating group is identical to a quantity ratio of the data leads to the touch leads in the lead area.

In a possible embodiment, data leads and touch leads coupled to the first bonding pins in a same row are located in a same metal layer, and data leads and touch leads coupled to the first bonding pins in two adjacent rows are located in different metal layers.

In a possible embodiment, the touch leads and the data leads are located in a source-drain metal layer or a gate metal layer.

In a possible embodiment, data leads and touch leads located in different metal layers overlap with each other in the lead area, and data leads and touch leads located in different metal layers and passing through two adjacent first bonding pins do not overlap with each other in the bonding area.

In a possible embodiment, a data lead or touch lead located in the lead area includes an oblique line segment and a serpentine line segment, the serpentine line segment extends from the bonding area to one end of the oblique line segment, and another end of the oblique line segment is connected to a corresponding data line or touch line.

In a possible embodiment, the bonding area includes four rows of the first bonding pins.

In a possible embodiment, the chip area further includes: at least one row of second bonding pins, and at least one row of first floating pins located in an area between the second bonding pins and the first bonding pins, where the first floating pins are used to support the touch and display driver integration chip bonded in the chip area.

In a second aspect, an embodiment of the disclosure provides an integrated circuit chip, including: a plurality of multiplexers, where each of the multiplexers is electrically connected to at most two of every three adjacent touch electrodes in a touch display substrate.

In a possible embodiment, the integrated circuit chip further includes: a plurality of output pins arranged in rows and columns and divided into: display output pins for bonding with display bonding pins, and touch output pins for bonding with touch bonding pins; where the touch output pins and the display output pins are mixedly arranged in each row of the output pins: in each column of the output pins, the output pins are sequentially offset by a set distance in a row direction, and the output pins in one column are all the display output pins or the touch output pins.

In a possible embodiment, in each row of the output pins, a quantity of the display output pins is greater than a quantity of the touch output pins, and at least one display output pin is arranged between two adjacent touch output pins.

In a possible embodiment, each row of the output pins includes a plurality of repeating groups arranged circularly, and a quantity ratio of the display output pins to the touch output pins in one repeating group is identical to a total quantity ratio of the display output pins to the touch output pins.

In a possible embodiment, the integrated circuit chip further includes: at least one row of input pins, and at least one row of second floating pins located in an area between the input pins and the output pins.

In a third aspect, an embodiment of the disclosure provides a display device, including: the touch display substrate as described in the first aspect.

In a possible embodiment, the display device further includes: at least one integrated circuit chip as described in the second aspect; where the integrated circuit chip is bonded to the bonding area of the touch display substrate.

Figure 1:
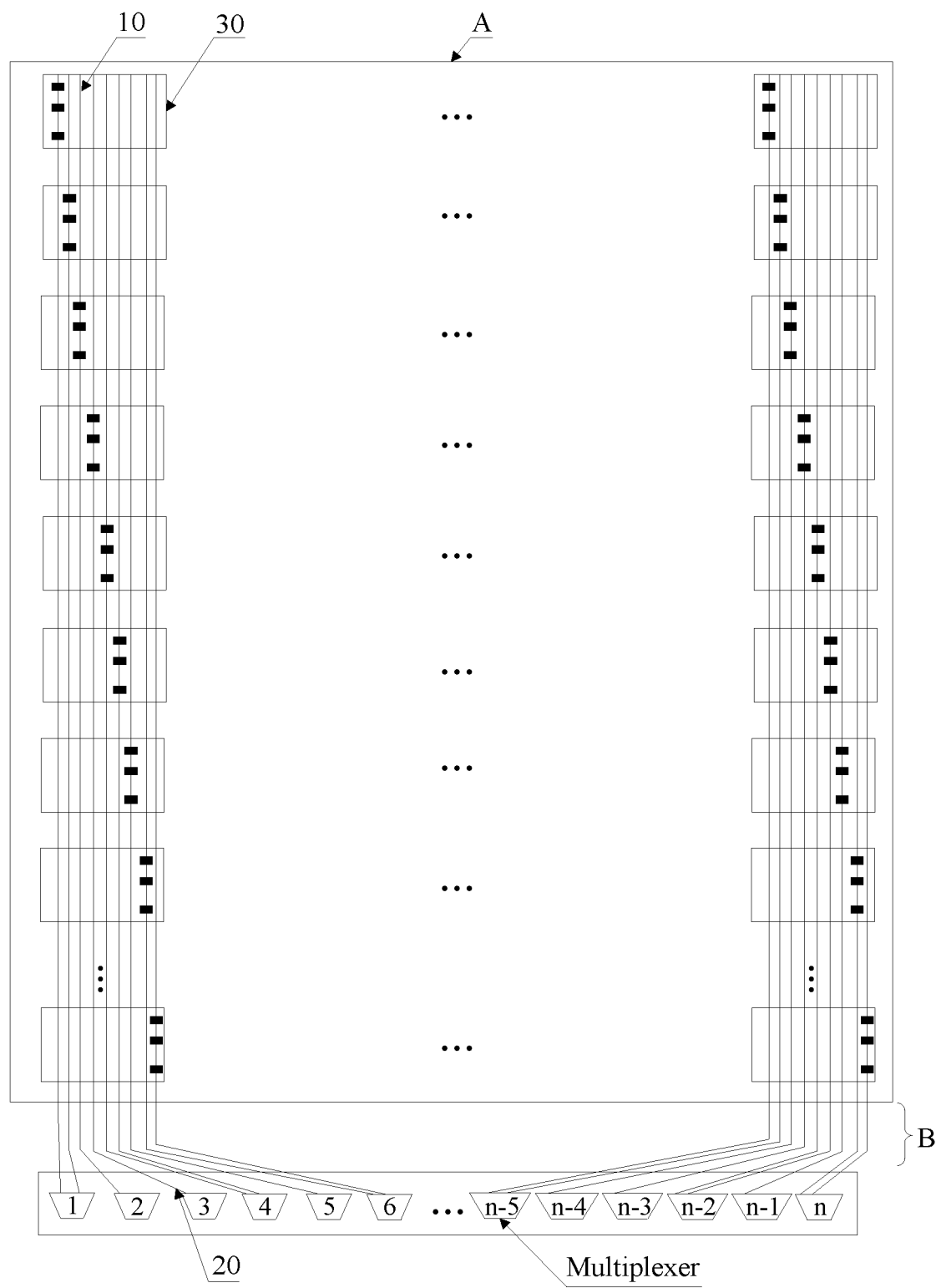
FIG. 1 is a schematic structural diagram of a touch display substrate according to an embodiment of the disclosure.

Reference numbers are as follows: A—active area, B—lead area, C—bonding area, X—row direction, Y—column direction, d—set distance: 10—touch line, 20—touch lead, 30—touch electrode, 40—multiplexing circuit, 50—first bonding pin, 50A—display bonding pin, 50B—touch bonding pin, 60—second bonding pin, 70—first floating pin, 80—third bonding pin, 100—multiplexer, 200—output pin, 200A—display output pin, 200B—touch output pin, 300—input pin, 400—second floating pin, 500—power supply pin.

DETAILED DESCRIPTION OF EMBODIMENTS

Embodiments of the disclosure provide a touch display substrate, an integrated circuit chip and a display device, to solve the above-mentioned problem in the related art.

In order to make the above-mentioned objects, features and advantages of the disclosure more apparent, the disclosure will be further illustrated below in combination with the drawings and embodiments. However, embodiments can be implemented in various forms and should not be understood as being limited to embodiments illustrated here; and on the contrary, these embodiments are provided to make the disclosure more comprehensive and complete, and the concept of embodiments is fully conveyed to those skilled in the art. The same reference numbers represent the same or similar structures in the drawings, so the repeated description thereof will be omitted. The words expressing the positions and directions described in the disclosure are all intended to illustrate by taking the drawings as examples, but can also be changed as needed, where the changes made are all contained in the protection scope of the disclosure. The drawings of the disclosure are merely intended to illustrate the relative position relationship, but not represent the real proportion.

It should be noted that the specific details are illustrated in the following description to fully understand the disclosure. But the disclosure can be implemented in many other ways different from that described here, and those skilled in the art can make the similar modifications without violating the connotation of the disclosure. Thus the disclosure is not limited by embodiments disclosed below: The following description of the specification is embodiments implementing the present application, but the said description is for the purpose of illustrating the general principle of the present application, and not intended to limit the scope of the present application. The protection scope of the disclosure should be limited by the attached claims. Referring to FIG. 1, FIG. 1 is a schematic structural diagram of a touch display substrate according to an embodiment of the disclosure, the touch display substrate has an active area A and a lead area B arranged in sequence, and the touch display substrate includes: a plurality of touch lines 10 arranged in the active area A; where the active area A may be a touch area in the touch display substrate, and when the touch display substrate adopts a self-capacitive touch solution, the touch area and the display area in the touch display substrate overlap, so the active area A may also be the touch area and the display area in the touch display substrate: a plurality of touch leads 20, each of the touch leads 20 is electrically connected to at least one touch line 10; for example, one touch lead 20 may be electrically connected to one touch line 10 or may be electrically connected to two touch lines 10: a plurality of touch electrodes 30 arranged in an array in the active area A, each of the touch electrodes 30 is coupled to at least one touch line 10; for example, one touch electrode 30 may be coupled to one touch line 10 or may be coupled to two touch lines 10; where at least two of every three adjacent touch electrodes 30 are connected to different Multiplexers (MUXs) through coupled touch lines 10 and touch leads 20.

As shown in FIG. 1, the touch electrodes 30 in the first row and first column and the second row and first column are coupled to pins corresponding to different data channels in a multiplexer 1 through respective corresponding touch lines 10 and touch leads 20, the touch electrode 30 in the third row and first column is coupled to a pin corresponding to a data channel in a multiplexer 2 through a corresponding touch line 10 and touch lead 20, the touch electrode 30 in the fourth row and first column is coupled to a pin corresponding to a data channel in a multiplexer 3 through a corresponding touch line 10 and touch lead 20, the touch electrodes 30 in the fifth row and first column and the six row and first column are coupled to pins corresponding to different data channels in a multiplexer 4 through respective corresponding touch lines 10 and touch leads 20, the touch electrode 30 in the seventh row and first column is coupled to a pin corresponding to a data channel in a multiplexer 5 through a corresponding touch line 10 and touch lead 20, and the touch electrode 30 in the eighth row and first column is coupled to a pin corresponding to a data channel in a multiplexer 6 through a corresponding touch line 10 and touch lead 20.

The three touch electrodes 30 in the first row and first column, the second row and first column and the third row and first column are coupled to the multiplexer 1 and the multiplexer 2 through the corresponding touch lines 10 and touch leads 20. The three touch electrodes 30 in the second row and first column, the third row and first column and the fourth row and first column are respectively coupled to the multiplexer 1 to multiplexer 3 through the corresponding touch lines 10 and touch leads 20.

It should be understood that one touch lead 20 is electrically connected to one touch line 10 and one touch electrode 30 is coupled to one touch line 10 as an example in the disclosure, and other situations can be analogized based on embodiments in the disclosure.

In an embodiment provided by the disclosure, at least two of every three adjacent touch electrodes 30 are connected to different multiplexers through the coupled touch lines 10 and touch leads 20, so that signals corresponding to a plurality of touch electrodes 30 touched by a toucher can be transmitted to a plurality of different multiplexers for processing when a user touches the display device including the touch display substrate provided by the disclosure, thereby effectively improving the touch response speed, touch calculation efficiency and reporting rate, and also reducing a noise difference between adjacent touch electrodes and improving the control accuracy.

Figure 2:
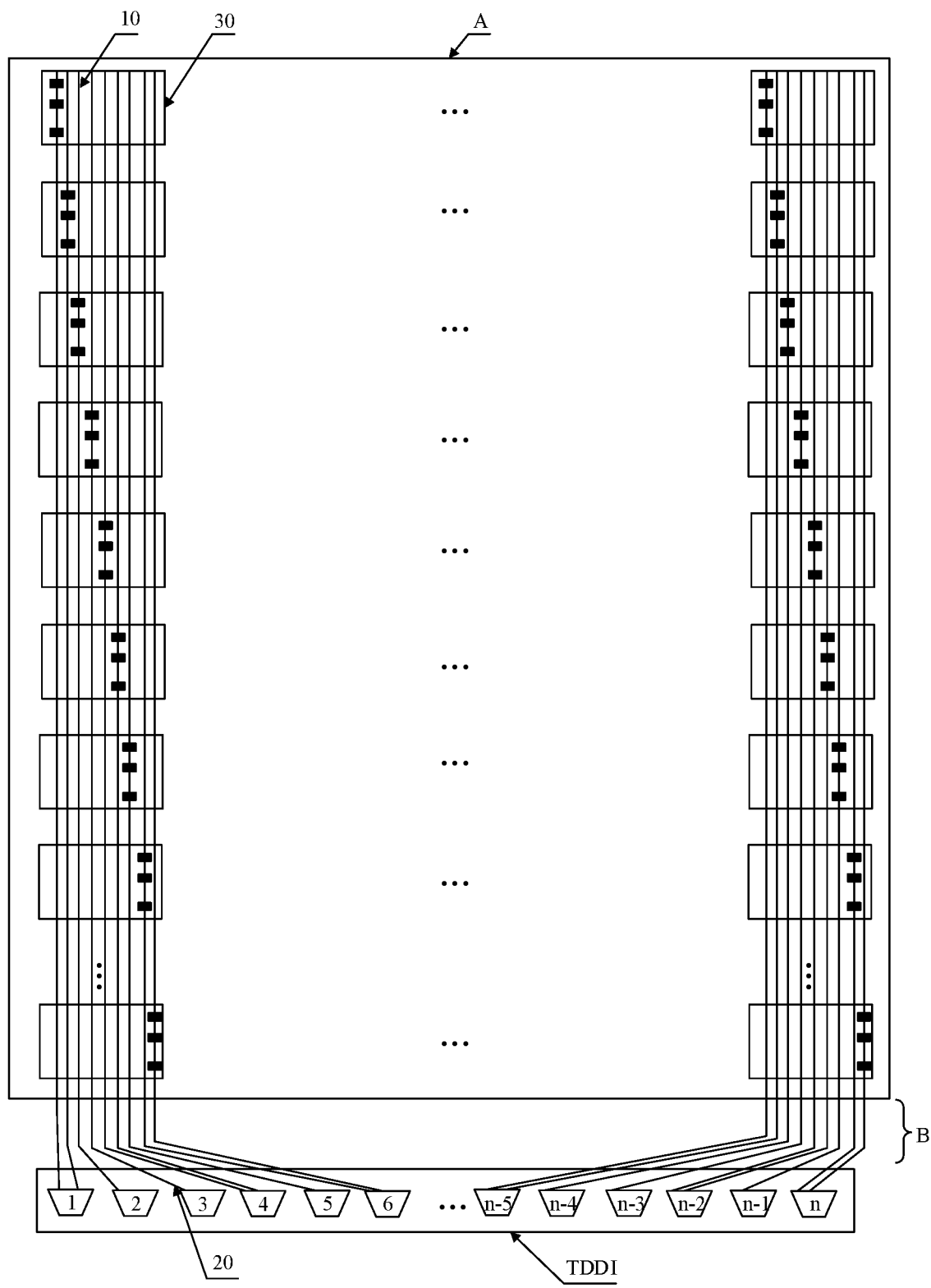
FIG. 2 and FIG. 3 are schematic structural diagrams of another touch display substrate according to an embodiment of the disclosure.
Figure 3:
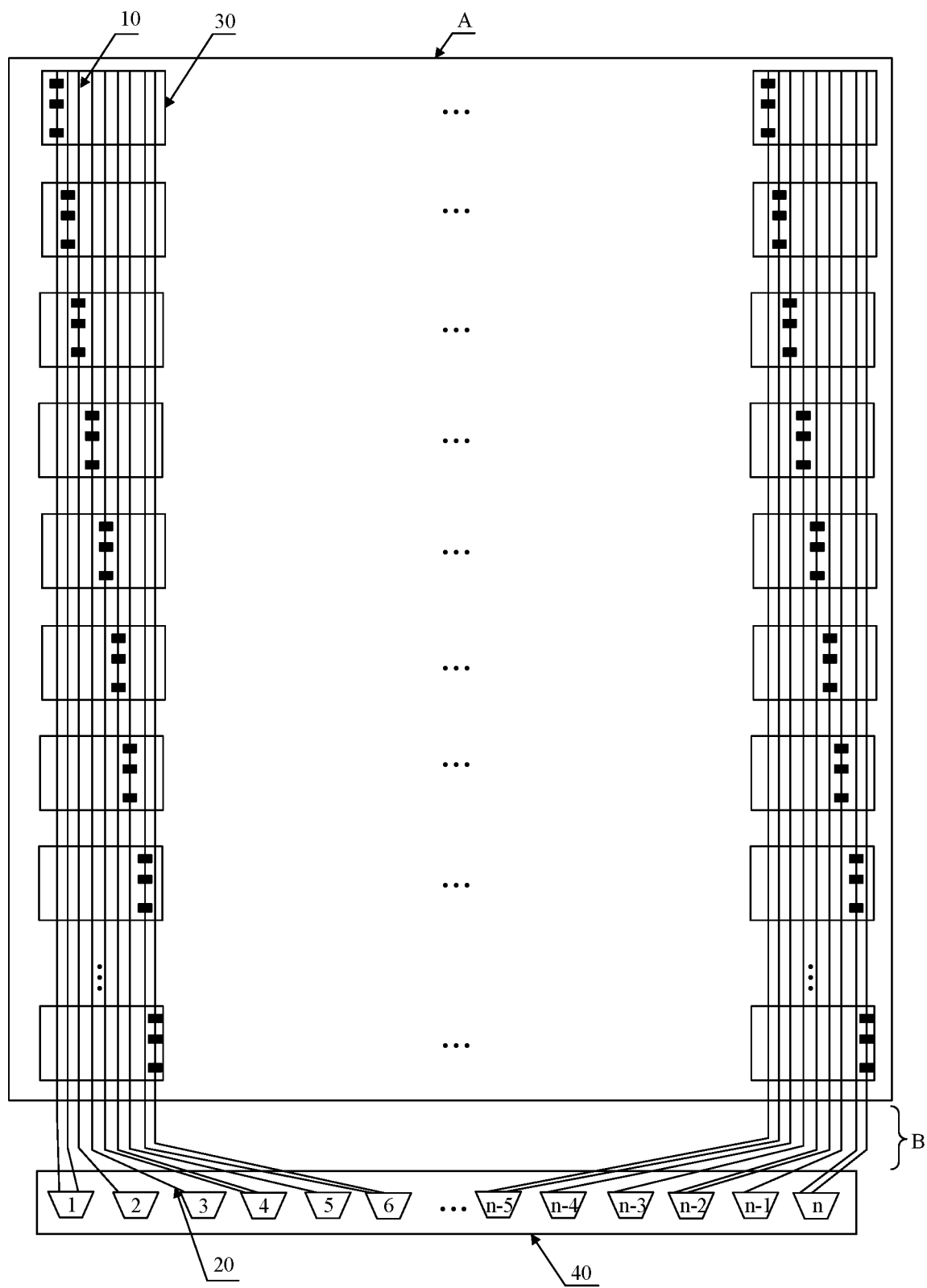

Referring to FIG. 2 and FIG. 3, FIG. 2 and FIG. 3 are schematic structural diagrams of another touch display substrate according to an embodiment of the disclosure, the touch display substrate is connected with a touch and display driver integration chip, and the multiplexers may be located in the Touch and Display Driver Integration (TDDI) chip (as shown in FIG. 2) or may be located in the touch display substrate. For example, in a process of fabricating the touch display substrate, a circuit (for example, called a multiplexing circuit) is fabricated directly on a base substrate of the touch display substrate through a patterning process, that is, the touch display substrate as shown in FIG. 3 further includes a multiplexing circuit 40, and the multiplexing circuit 40 includes a plurality of multiplexers.

It should be understood that FIG. 2 shows that a TDDI chip includes a plurality of multiplexers, and FIG. 3 shows that a multiplexing circuit includes a plurality of multiplexers, but this case cannot be understood as: a display device with the above-mentioned touch display substrate has only one TDDI chip, or the touch display substrate has only one multiplexing circuit. In practical applications, the display device may have a plurality of TDDI chips, and the touch display substrate may have a plurality of multiplexing circuits.

In a possible embodiment, in an array including touch electrodes 30, each column includes a plurality of touch electrode groups, each touch electrode group includes at most M touch electrodes 30, M is a total quantity of data channels of one multiplexer, and at most two touch electrodes 30 in a touch electrode group are electrically connected to a same multiplexer.

For example, each multiplexer shown in FIG. 1 includes 8 data channels, and the touch electrode group may include 6 touch electrodes 30 or 8 touch electrodes 30, but cannot include 9 touch electrodes 30. In a case that every three adjacent touch electrodes 30 are connected to at least two multiplexers through the coupled touch lines 10 and touch leads 20, at most two touch electrodes 30 in the above touch electrode group are electrically connected to the same multiplexer, as shown in FIG. 1. Thus, data generated by a same touch point can be processed by a plurality of multiplexers, thereby improving the touch response speed and processing capability.

Figure 4:
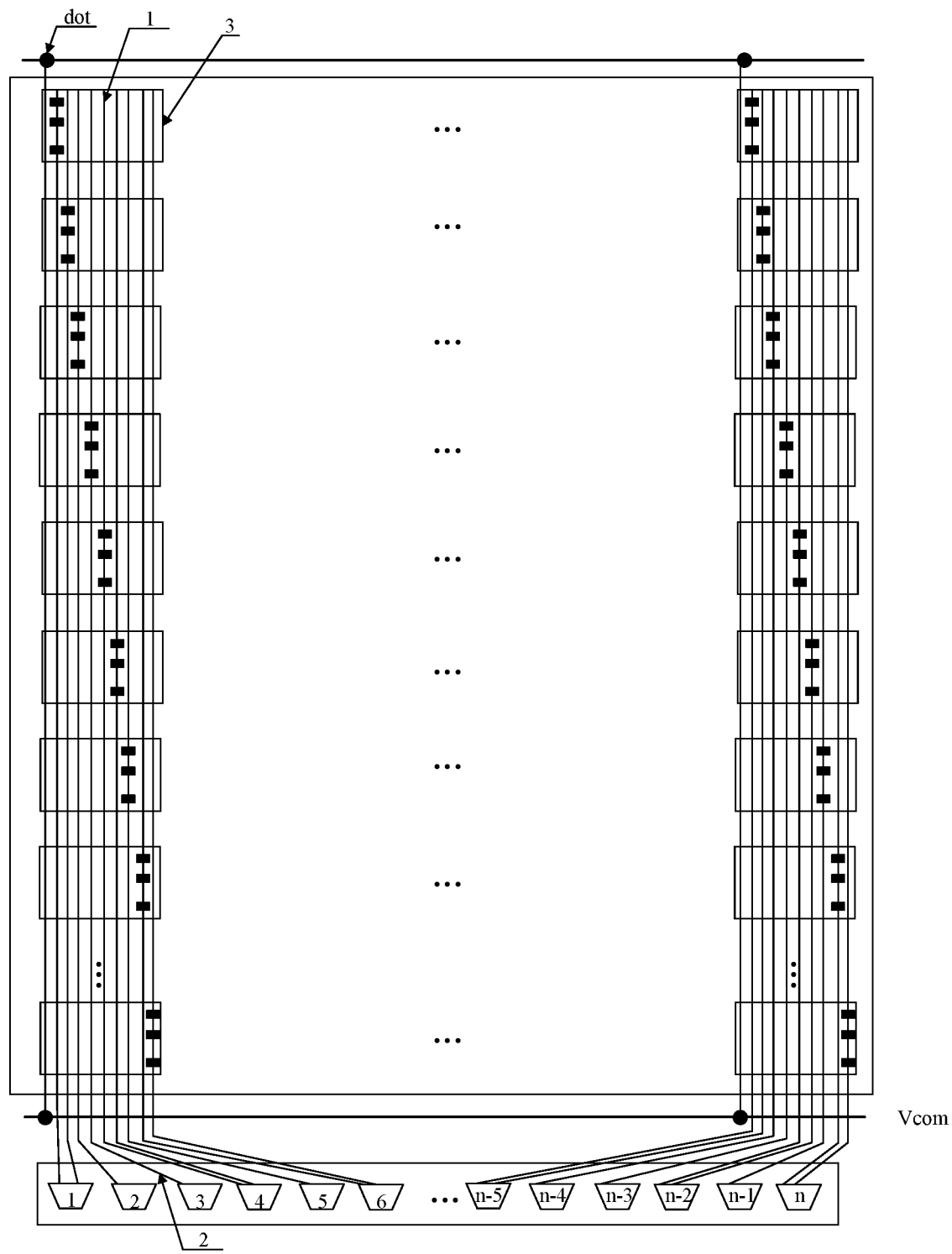
FIG. 4 is a schematic structural diagram of another touch display substrate according to an embodiment of the disclosure.

Referring to FIG. 4, FIG. 4 is a schematic structural diagram of another touch display substrate according to an embodiment of the disclosure, connection dots may also be set on a common (Vcom) line in the touch display substrate, for connecting dummy touch lines (that is, touch lines 10 not connected to any touch electrode 30) in a same column, thus reducing the noise difference between blocks and improving the touch accuracy.

It should be noted that a black square disposed on a touch line 10 represents an electrical connection with a touch electrode 30 below the touch line 10 in FIGS. 1 to 4.

In the above-mentioned touch electrode group, a formula used for any touch electrode 30 to be electrically connected to a pin number of a same integrated circuit chip (such as TDDI chip or multiplexing circuit) is:

$$N = k \times (a - M \times c) - d \begin{cases} \text{if } a \leq M, & c = 0 \\ \text{if } M + 1 \leq a \leq 2M, & c = 1 \\ \cdots \\ \text{if } (c+1) \times M \leq a \leq 4M, & c = k \end{cases} \quad (1)$$

Here, N is the pin number of the touch electrode 30 in the current row in the touch electrode group in the corresponding integrated circuit chip, M is a total quantity of signals output by one multiplexer in the integrated circuit chip used for each touch electrode group, k is a difference between a total quantity of touch electrode groups in a same column in the touch display panel and 1, a is a current row number of the touch electrode 30 in the touch display panel, c is a natural number from 0 to k, and d=k−c.

Please continuing to refer to FIG. 4, it is assumed that there are 6 multiplexers in the integrated circuit chip shown in FIG. 4 and each multiplexer includes 8 signal channels, so this integrated circuit chip includes 48 signal channels, and 48 pins corresponding to the 48 signal channels are coupled to 48 touch electrodes 30 through data lines and data leads. For the 48 data channels corresponding to the multiplexer 1 to multiplexer 6 in the above integrated circuit chip, pin numbers in the integrated circuit are 1 to 48 in sequence, for example, the $1^{st}$ to $8^{th}$ data channels of the multiplexer 1 correspond to pin numbers 1 to 8 in the integrated circuit chip, the $1^{st}$ to $8^{th}$ data channels of the multiplexer 2 correspond to pin numbers 9 to 16 in the integrated circuit chip, and the $1^{st}$ to $8^{th}$ data channels of the multiplexer 6 correspond to pin numbers 41 to 48 in the integrated circuit chip.

Assuming that each touch electrode group uses one multiplexer in the integrated circuit chip to output a total of 8 signals, then M=8. Taking the first 48 touch electrodes 30 in the first column in FIG. 4 as an example, these touch electrodes 30 are divided into 6 touch electrode groups, and correspondingly, 6 multiplexers in the integrated circuit chip need to be used, where the pin numbers of these 6 multiplexers in the integrated circuit are 1 to 48. The pin number in the integrated chip circuit to which any touch electrode 30 is connected can be calculated by the above formula (1). Referring to Table 1, Table 1 is a relationship table between the touch electrodes 30 and the pin numbers in an embodiment of the disclosure.

TABLE 1

| Row number of current touch electrode (a) | c | d | Pin number (N) | Multiplexer |
|---|---|---|---|---|
| 1 | 0 | 5 | 1 | 1 |
| 2 | 0 | 5 | 7 | 1 |
| 3 | 0 | 5 | 13 | 2 |
| 4 | 0 | 5 | 19 | 3 |
| 5 | 0 | 5 | 25 | 4 |
| 6 | 0 | 5 | 31 | 4 |
| 7 | 0 | 5 | 37 | 5 |
| 8 | 0 | 5 | 43 | 6 |
| 9 | 1 | 4 | 2 | 1 |
| 10 | 1 | 4 | 8 | 1 |
| 11 | 1 | 4 | 14 | 2 |
| 12 | 1 | 4 | 20 | 3 |
| 13 | 1 | 4 | 26 | 4 |
| 14 | 1 | 4 | 32 | 4 |
| 15 | 1 | 4 | 38 | 5 |
| 16 | 1 | 4 | 44 | 6 |
| 17 | 2 | 3 | 3 | 1 |
| 18 | 2 | 3 | 9 | 2 |
| 19 | 2 | 3 | 15 | 2 |
| 20 | 2 | 3 | 21 | 3 |
| 21 | 2 | 3 | 27 | 4 |
| 22 | 2 | 3 | 33 | 5 |
| 23 | 2 | 3 | 39 | 5 |
| 24 | 2 | 3 | 45 | 6 |
| 25 | 3 | 2 | 4 | 1 |
| 26 | 3 | 2 | 10 | 2 |
| 27 | 3 | 2 | 16 | 2 |
| 28 | 3 | 2 | 22 | 3 |
| 29 | 3 | 2 | 28 | 4 |
| 30 | 3 | 2 | 34 | 5 |
| 31 | 3 | 2 | 40 | 5 |
| 32 | 3 | 2 | 46 | 6 |
| 33 | 4 | 1 | 5 | 1 |
| 34 | 4 | 1 | 11 | 2 |
| 35 | 4 | 1 | 17 | 3 |
| 36 | 4 | 1 | 23 | 3 |
| 37 | 4 | 1 | 29 | 4 |
| 38 | 4 | 1 | 35 | 5 |
| 39 | 4 | 1 | 41 | 6 |
| 40 | 4 | 1 | 47 | 6 |
| 41 | 5 | 0 | 6 | 1 |
| 42 | 5 | 0 | 12 | 2 |
| 43 | 5 | 0 | 18 | 3 |
| 44 | 5 | 0 | 24 | 3 |
| 45 | 5 | 0 | 30 | 4 |
| 46 | 5 | 0 | 36 | 5 |
| 47 | 5 | 0 | 42 | 6 |
| 48 | 5 | 0 | 48 | 6 |

It should be understood that, when M is less than a total quantity of data channels of one multiplexer, pins corresponding to first M data channels in each multiplexer can be selected to be connected to the corresponding touch leads 20. Moreover, in the integrated circuit chip, since the pin numbers may not be numbered in the above-mentioned way, the above formula (1) can be modified according to the corresponding rule of the data channels and the pin numbers in the integrated circuit, and the modification is also included in the protection scope of this solution.

Figure 5:
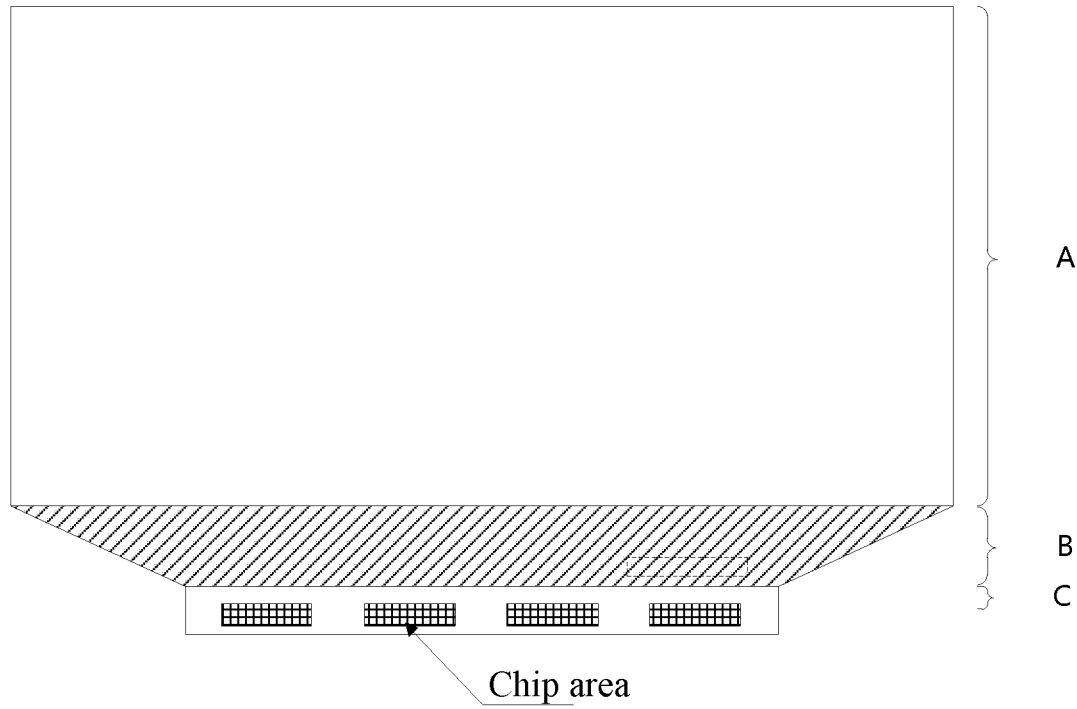
FIG. 5 is a schematic diagram of various areas in a touch display substrate according to an embodiment of the disclosure.
Figure 6:
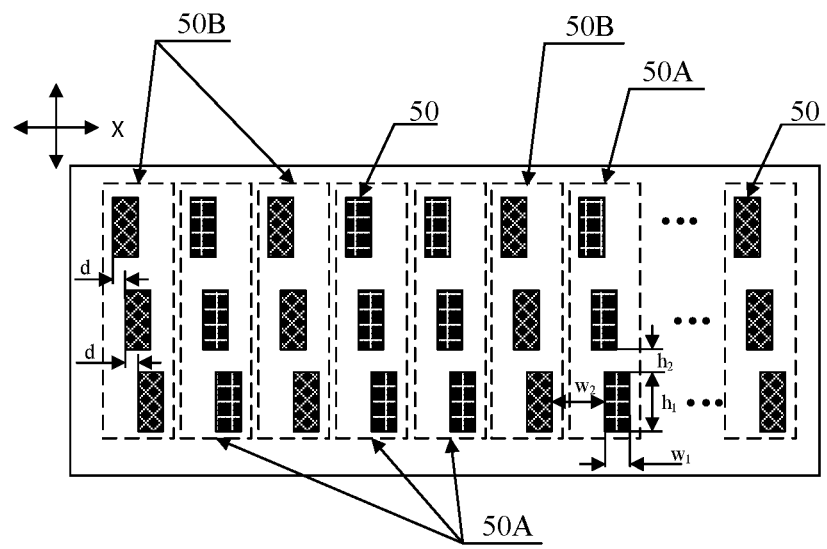
FIG. 6 is a schematic structural diagram of a touch display substrate in the chip area according to an embodiment of the disclosure.

Referring to FIG. 5 and FIG. 6, FIG. 5 is a schematic diagram of various areas in a touch display substrate according to an embodiment of the disclosure, and FIG. 6 is a schematic structural diagram of a touch display substrate in the chip area according to an embodiment of the disclosure. The touch display substrate further includes a plurality of data lines (not shown in FIG. 5 and FIG. 6) arranged in the active area, and a plurality of data leads (not shown in FIG. 5 and FIG. 6) arranged in the lead area. The touch substrate further includes a bonding area C located on a side of the lead area B away from the active area A and including at least one chip area, and the chip area includes: a plurality of first bonding pins 50 arranged in rows and columns and divided into: display bonding pins 50A coupled to the data lines through the data leads, and touch bonding pins 50B coupled to the touch lines 10 through the touch leads 20.

The touch bonding pins 50B and the display bonding pins 50A are mixedly arranged in each row of first bonding pins 50.

As shown in FIG. 6, the mixing manner in each row may be: 1 touch bonding pin 50B→1 display bonding pin 50A→1 touch bonding pin 50B→2 display bonding pins 50A, or 1 touch bonding pin 50B→2 display bonding pins 50A→1 touch bonding pin 50B→1 display bonding pin 50A, or 1 touch bonding pin 50B→1 display bonding pin 50A→1 touch bonding pin 50B→2 display bonding pins 50A→1 touch bonding pin 50B→2 display bonding pins 50A→1 touch bonding pin 50B. The specific mixing manner may be freely set according to the actual situation, and is not limited here.

In an embodiment of the disclosure, a width and length of each first bonding pin 50 are $w_1$ and $h_1$, a distance between two adjacent first bonding pins 50 in a same column in a column direction is $h_2$, and a distance between two adjacent first bonding pins 50 in a same row in a row direction is $w_2$. A value range of $w_1$ is 12 to 20 um, a value range of $h_1$ is 90 to 120 um, a value range of $w_2$ is 20 to 30 um, and a value range of $h_2$ is 15 to 25 um. For example, $w_1$ may be set to 15 um, $h_1$ may be set to 10 um, $w_2$ may be set to 25 um, and $h_2$ may be set to 20 um.

In each column of first bonding pins 50, the first bonding pins 50 are sequentially offset by a set distance d in the row direction X, and the first bonding pins 50 in a same column are all the display bonding pins 50A or the touch bonding pins 50B, where the value range of d is 7 to 11 um, for example, d may be set to 10 um.

In an embodiment provided by the disclosure, the touch bonding pins 50B and the display bonding pins 50A are arranged mixedly in each row of first bonding pins 50; and in each column of first bonding pins 50, the first bonding pins 50 are sequentially offset by the set distance d in the row direction X, and the first bonding pins 50 in the same column are all the display bonding pins 50A or the touch bonding pins 50B, so that the data leads connected to the display bonding pins 50A and the touch leads 20 connected to the touch bonding pins 50B in the same row of first bonding pins 50 are wired mixedly in a same metal layer, and the data leads and the touch leads 20 connected to two adjacent rows of first bonding pins 50 are arranged in different metal layers, so there is no need to arrange a separate TPM metal layer for the touch leads 20 to cause the line breakage risk, and the width of the lead area B will not be increased; and at the same time, the touch leads 20 electrically connected to the touch bonding pins 50B in the lead area B can be evenly distributed in the lead area B, so that the wiring space of the leads in the lead area B can be reduced while increasing a quantity of touch leads 20, to enable the touch display substrate to support mainstream touch resolutions.

In each column of first bonding pins 50, the first bonding pins 50 are set to be sequentially offset by the set distance d in the row direction X, and the first bonding pins 50 in the same column are all the display bonding pins 50A or the touch bonding pins 50B, to facilitate connections of the first bonding pins 50 in different rows with the corresponding data leads or touch leads 20, and facilitate wiring between two adjacent first bonding pins 50.

Figure 7:
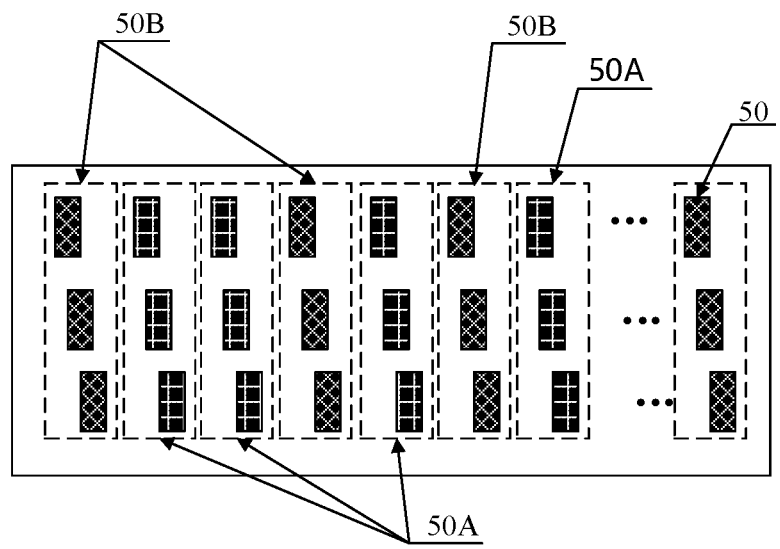
FIG. 7 is a schematic structural diagram of another touch display substrate in the chip area according to an embodiment of the disclosure.

Referring to FIG. 6 and FIG. 7, FIG. 7 is a schematic structural diagram of another touch display substrate in the chip area according to an embodiment of the disclosure. In each row of the first bonding pins 50, a quantity of the display bonding pins 50A is greater than a quantity of the touch bonding pins 50B, and at least one display bonding pin 50A is arranged between two adjacent touch bonding pins 50B.

By setting the quantity of the display bonding pin 50A greater than the quantity of the touch bonding pin 50B in each row of first bonding pins 50, it is possible to adapt to the fact that a quantity of data lines is greater than a quantity of touch lines 10 in the display touch substrate, avoiding an increase in an area of the chip area caused by wasting too many useless touch bonding pins 50B, and avoiding addition of too many useless touch leads 20, so that an overall area occupied by the touch leads 20 in the lead area B is reduced to facilitate arrangement of the touch leads 20 and the data leads in the lead area B.

Figure 8:
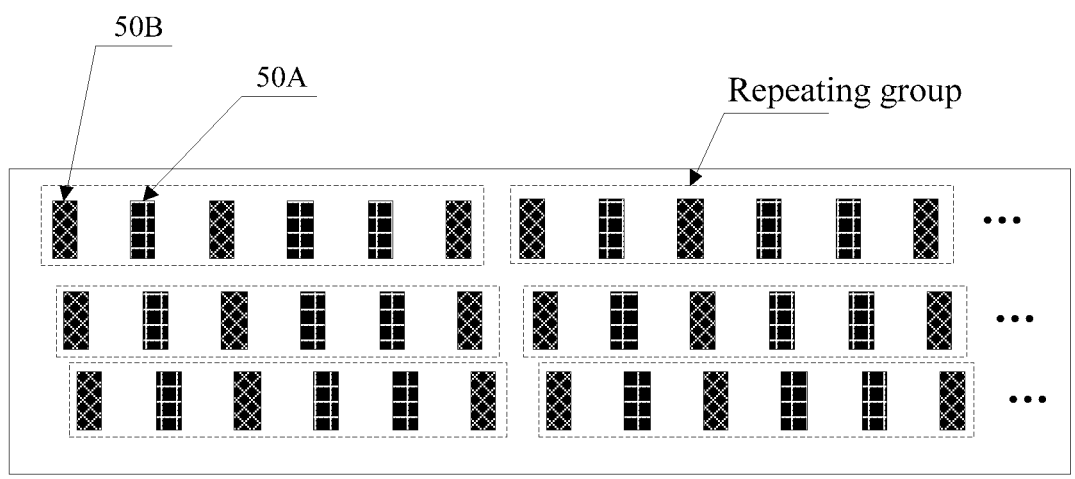
FIG. 8 is a schematic structural diagram of a repeating group in the chip area according to an embodiment of the disclosure.
Figure 9:
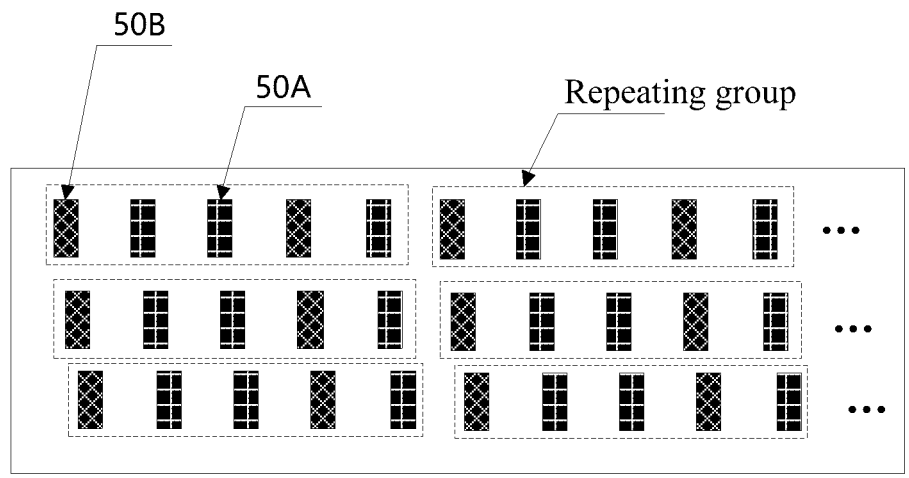
FIG. 9 is a schematic structural diagram of another repeating group in the chip area according to an embodiment of the disclosure.

Referring to FIG. 8 and FIG. 9, FIG. 8 is a schematic structural diagram of a repeating group in the chip area according to an embodiment of the disclosure, and FIG. 9 is a schematic structural diagram of another repeating group in the chip area according to an embodiment of the disclosure. Each row of the first bonding pins 50 includes a plurality of repeating groups arranged circularly, and a quantity ratio of the display bonding pins 50A to the touch bonding pins 50B in one repeating group is identical to a quantity ratio of the data leads to the touch leads 20 in the lead area B.

Assuming that the quantity ratio of the data lines to the touch lines 10 in the display area is 3:2, since the data leads in the lead area B correspond to the data lines one by one and the touch leads 20 in the lead area B correspond to the touch lines 10 one by one, it can be determined that the quantity ratio of the data leads to the touch leads 20 in the lead area B is 3:2, and then the quantity ratio of the display bonding pins 50A to the touch bonding pins 50B in each cycle group of the chip area may also set to 3:2. The display bonding pins 50A and the touch bonding pins 50B in the repeating group may be arranged in the row direction in the following manner as shown in FIG. 8: 1 touch bonding pin 50B→1 display bonding pin 50A→1 touch bonding pin 50B→2 display bonding pins 50A; or may be arranged in the row direction in the following manner as shown in FIG. 9: 1 touch bonding pin 50B→2 display bonding pins 50A→1 touch bonding pin 50B→1 display bonding pin 50A.

In an embodiment provided by the disclosure, each row of first bonding pins 50 are set as a plurality of repeating groups arranged circularly, and the quantity ratio of the display bonding pins 50A to the touch bonding pins 50B in one repeating group is identical to the quantity ratio of the data leads to the touch leads 20 in the lead area B, so that the display bonding pins 50A and the touch bonding pins 50B are uniformly mixed, to thereby facilitate the arrangement of the data leads and the touch leads connected to the first bonding pins 50 of the same row in the same metal layer.

Figure 10:
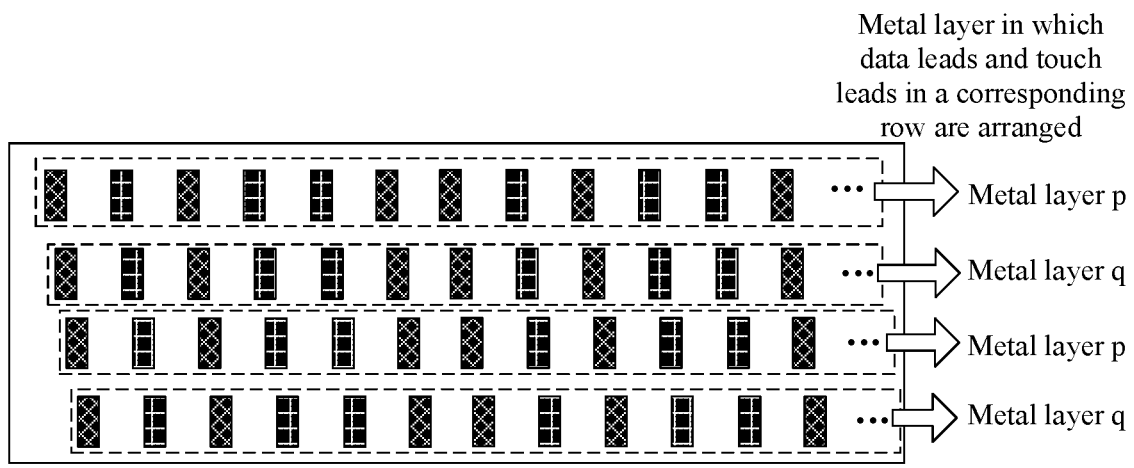
FIG. 10 is a schematic diagram of a corresponding relationship between a plurality of rows of bonding pins and metal layers according to an embodiment of the disclosure.

Referring to FIG. 10, FIG. 10 is a schematic diagram of a corresponding relationship between a plurality of rows of bonding pins and metal layers according to an embodiment of the disclosure, data leads and touch leads 20 coupled to the first bonding pins 50 in a same row are located in a same metal layer, and data leads and touch leads 20 coupled to the first bonding pins 50 in two adjacent rows are located in different metal layers.

As shown in FIG. 10, the bonding area can include four rows of first bonding pins 50, thus increasing a quantity of bonding pins, increasing the supported touch resolution, and then encompassing the resolution of the mainstream touch screens.

In FIG. 10, the first bonding pins 50 in the first row correspond to the metal layer p, and the corresponding data leads and touch leads 20 in the corresponding row are arranged in the metal layer p of the touch display substrate. The first bonding pins 50 in the second row correspond to the metal layer q, and the corresponding data leads and touch leads 20 in the corresponding row are arranged in the metal layer q of the touch display substrate. The first bonding pins 50 in the third row correspond to the metal layer p, and the corresponding data leads and touch leads 20 in the corresponding row are arranged in the metal layer p of the touch display substrate. The first bonding pins 50 in the fourth row correspond to the metal layer q, and the corresponding data leads and touch leads 20 in the corresponding row are arranged in the metal layer q of the touch display substrate.

In an embodiment provided by the disclosure, by arranging the data leads and the touch leads 20 coupled to the first bonding pins 50 in the same row in the same metal layer, and arranging the data leads and the touch leads 20 coupled to the first bonding pins 50 in two adjacent rows in different metal layers, the data leads and the touch leads 20 can be arranged using two metal layers.

In a possible embodiment, the touch leads 20 and the data leads are located in a source-drain metal layer or a gate metal layer.

Taking FIG. 10 as an example, the metal layer p may be a source-drain metal layer, and the metal layer q may be a gate metal layer; or the metal layer p may be a gate metal layer, and the metal layer q may be a source-drain metal layer.

In an embodiment provided by the disclosure, the risk of line breakage of the touch leads 20 can be prevented by arranging the touch leads 20 and the data leads in the source-drain metal layer or the gate metal layer.

Figure 11:
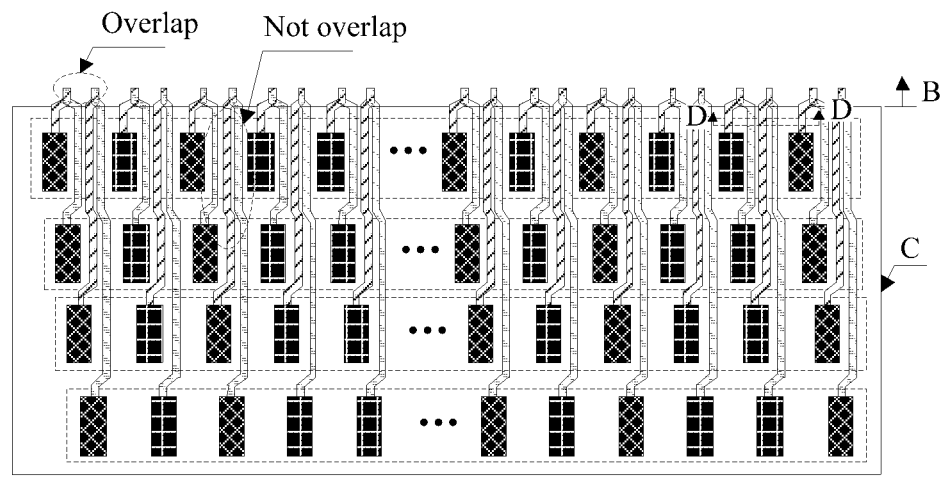
FIG. 11 is a schematic diagram of a positional relationship among data leads, touch leads and bonding pins according to an embodiment of the disclosure.

Referring to FIG. 11, FIG. 11 is a schematic diagram of a positional relationship among data leads, touch leads and bonding pins according to an embodiment of the disclosure. Data leads and touch leads 20 located in different metal layers overlap with each other in the lead area B, the data leads and the touch leads 20 located in different metal layers and passing through two adjacent first bonding pins do not overlap with each other in the bonding area C.

In FIG. 11, the data leads and touch leads 20 coupled to the first bonding pins 50 in the first and third rows are arranged in the gate metal layer, and the data leads and touch leads 20 coupled to the first bonding pins 50 in the second and fourth rows are arranged in the source-drain metal layer. In each row of first bonding pins 50, the data leads and touch leads 20 passing through two adjacent first bonding pins 50 do not overlap with each other, that is, the data leads and touch leads 20 located in the bonding area C do not overlap with each other.

Figure 12:
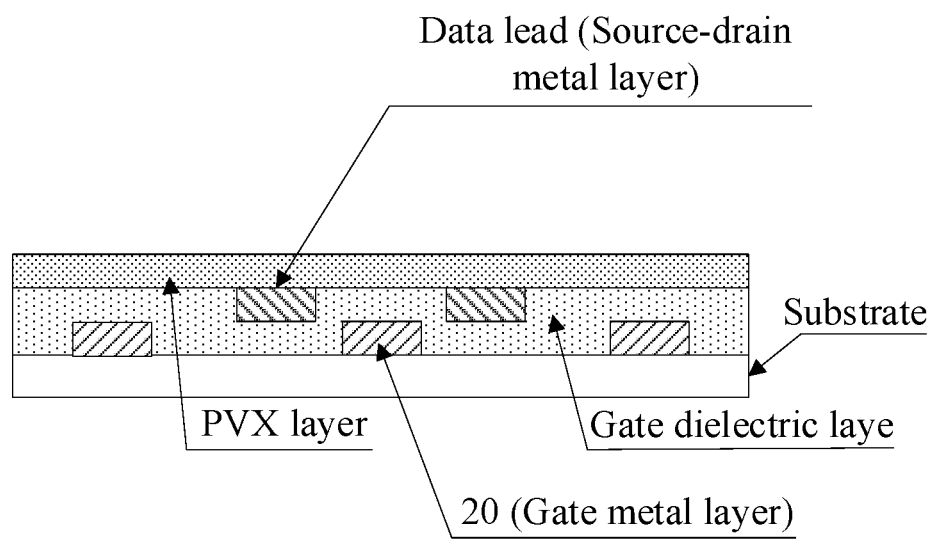
FIG. 12 is a cross-sectional view of the touch display substrate in FIG. 11 at DD according to an embodiment of the disclosure.

Referring to FIG. 12, FIG. 12 is a cross-sectional view of the touch display substrate in FIG. 11 at DD according to an embodiment of the disclosure.

The touch display substrate includes a substrate, and a gate metal layer, a gate dielectric layer, a source-drain metal layer and an insulating layer/passivation layer (PVX layer) sequentially stacked on the substrate. FIG. 12 shows the patterned gate metal layer and the patterned source-drain metal layer at the DD cross-sectional position in FIG. 11. The data leads and source-drain leads connected to the first bonding pins 50 in the first row and the data leads and source-drain leads connected to the first bonding pins 50 in the third row are arranged in the gate metal layer; and the data leads and source-drain leads connected to the first bonding pins 50 in the second row and the data leads and source-drain leads connected to the first bonding pins 50 in the fourth row are arranged in the source-drain metal layer. It can be seen from FIG. 12 that the data leads and the touch leads 20 in the chip area do not overlap, so that the total height of the film layer in the chip can be kept consistent, thereby easily bonding the first bonding pins 50 in the chip area to the integrated circuit chip. Assuming that the overall height of the film layer in the chip area varies, the extremely high alignment accuracy is required to complete the bonding when bonding the integrated circuit chip.

In an embodiment provided by the disclosure, the space occupied by the data leads and the touch leads 20 in the corresponding metal layer can be saved by allowing the data leads and the touch leads 20 located in different metal layers to overlap with each other in the lead area B, to facilitate the reasonable wiring; while the data leads and the touch leads 20 passing through two adjacent first bonding pins 50 in the bonding area C do not overlap with each other, so that the total height of the film layer between adjacent pins can be kept consistent, and thus the chip area of the touch display substrate can be easily bonded to the integrated circuit chip.

Figure 13:
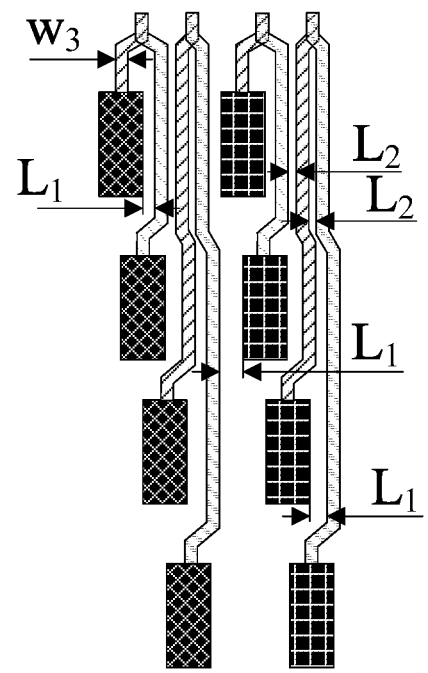
FIG. 13 is a schematic diagram of sizes of data leads and touch leads in the chip area according to an embodiment of the disclosure.

Referring to FIG. 13, FIG. 13 is a schematic diagram of sizes of data leads and touch leads in the chip area according to an embodiment of the disclosure.

The widths of the data lead and the touch lead 20 are both $w_3$, the line spacing is $L_2$, and the distance between the data lead or touch lead 20 and the first bonding pin 50 is $L_1$. A value range of $w_3$ is [3, 6] um, and for example, may be set to 3.6 um: a value range of $L_1$ is greater than or equal to 3 um, and for example, may be set to 4.3 um; and a value range of $L_2$ is greater than or equal to 2.5 um, and for example, may be set to 3.8 um.

Since the lead area B is an inverted trapezoid, some of the data leads and the touch leads 20 are oblique lines when the data leads and the touch leads 20 extend from the first bonding pins 50 to the active area A.

Figure 14:
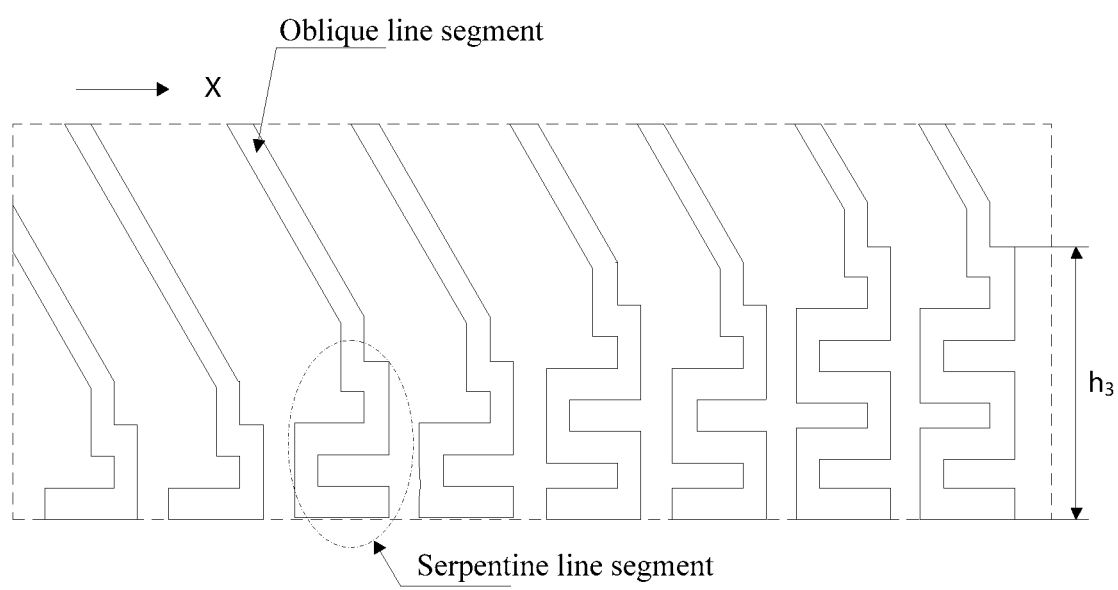
FIG. 14 is a schematic diagram of wiring of data leads/touch leads in the lead area according to an embodiment of the disclosure.

Referring to FIG. 14, FIG. 14 is a schematic diagram of wiring of data leads/touch leads in the lead area B according to an embodiment of the disclosure, and FIG. 14 is a schematic diagram of wiring of the area inside the dotted box in FIG. 5.

In order to set a reasonable distance between two adjacent oblique lines in the same metal layer, in an embodiment provided by the disclosure, a data lead or touch lead 20 located in the lead area B includes an oblique line segment and a serpentine line segment, the serpentine line segment extends from the bonding area C to one end of the oblique line segment, and another end of the oblique line segment is connected to a corresponding data line or touch line 10.

As shown in FIG. 14, the data lead/touch lead 20 extending from the bonding area C is arranged as a serpentine line segment in a column direction, and then extends to the corresponding data line/touch line 10 in the active area A to form an oblique line segment. Also, a height $h_3$ of the serpentine line increases gradually in the row direction.

It should be noted that the data leads and touch leads 20 in the lead area B overlap, so the specific types of leads are not distinguished in FIG. 14, mainly to show the form of the data leads/touch leads 20.

It should be noted that the touch electrode 30 in embodiments of the disclosure may be a self-capacitive touch electrode.

Figure 15:
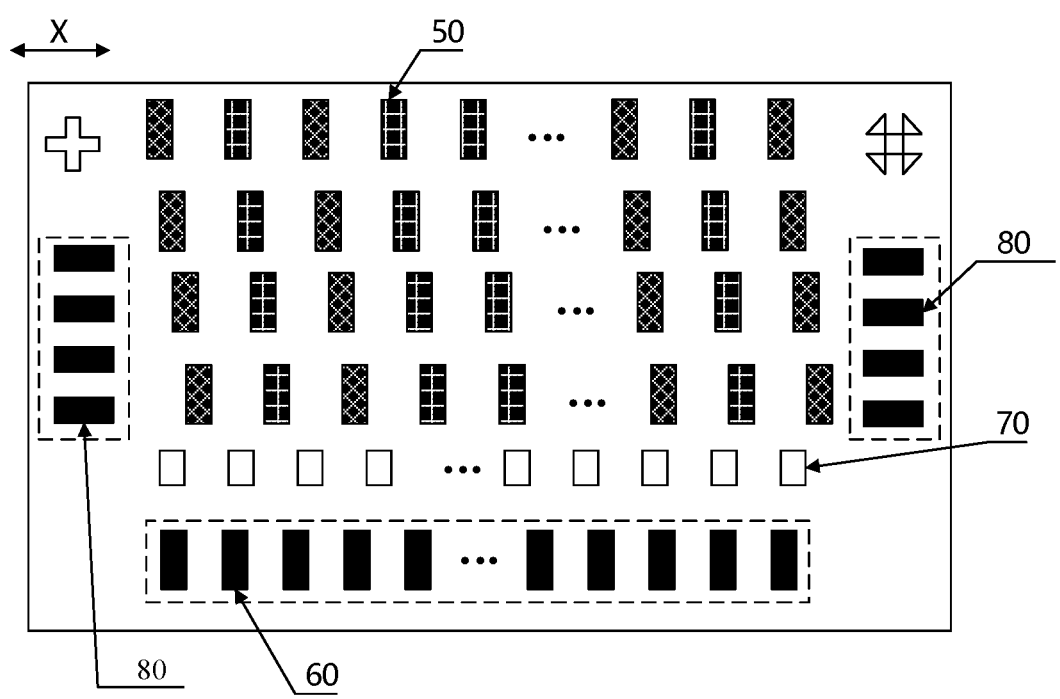
FIG. 15 is a schematic structural diagram of another touch display substrate in the chip area according to an embodiment of the disclosure.

Referring to FIG. 15, FIG. 15 is a schematic structural diagram of another touch display substrate in the chip area according to an embodiment of the disclosure, the chip area of the touch display substrate further includes: at least one row of second bonding pins 60, and at least one row of first floating pins 70 located in an area between the second bonding pins 60 and the first bonding pins 50. The second bonding pins 60 are configured to bond to input pins in the touch and display driver integration chip, the first bonding pins 50 are configured to bond to output pins in the touch and display driver integration chip, and the first floating pins 70 are configured to support the touch and display driver integration chip bonded in the chip area.

In an embodiment provided by the disclosure, the arrangement of the first floating pins 70 supporting the touch and display driver integration chip in the area between the first bonding pins 50 and the second bonding pins 60 can prevent the middle part of the touch and display driver integration chip from being sunken to cause poor bonding, and thus improve the bonding yield.

Moreover, the touch display substrate further includes third bonding pins 80 located on both sides of the first bonding pins 50, the second bonding pins 60 and the first floating pins 70 in the first direction. The third bonding pins 80 are configured to bond to power supply pins of the touch and display driver integration chip.

The distance between the first floating pin 70 and the first bonding pin 50/second bonding pin 60 may refer to subsequent relevant introduction of the integrated circuit chip, and will not be repeated here in order to save space.

Figure 16:
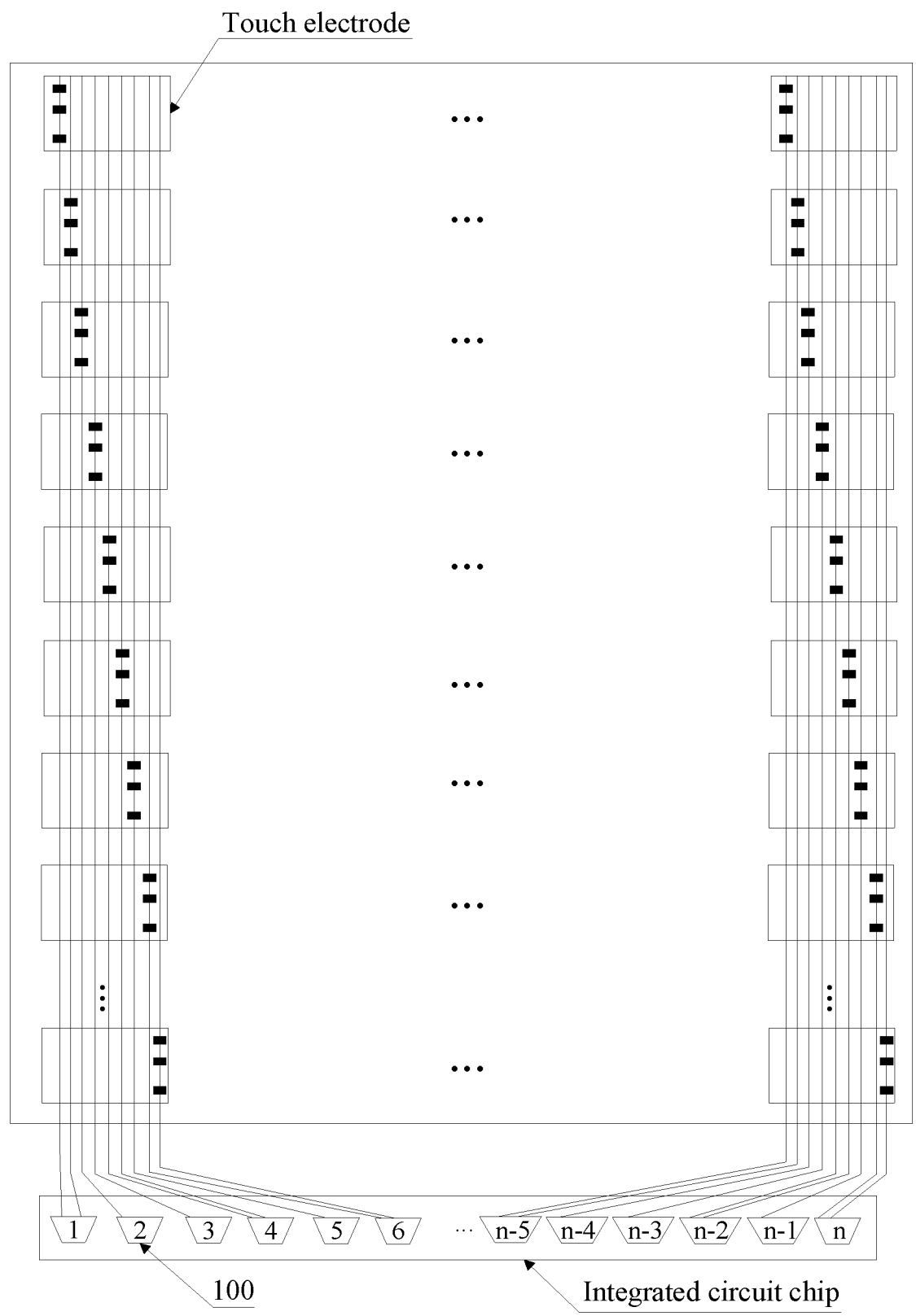
FIG. 16 is a schematic structural diagram of an integrated circuit chip according to an embodiment of the disclosure.

Based on the same inventive concept, an embodiment of the disclosure provides an integrated circuit chip corresponding to the chip area of the above-mentioned touch display substrate. Embodiments may refer to the related description of the bonding pins in the chip area of the touch display substrate, and the repeated description thereof will be omitted. Referring to FIG. 16, FIG. 16 is a schematic structural diagram of an integrated circuit chip according to an embodiment of the disclosure, the integrated circuit chip includes: a plurality of multiplexers 100, where each of the multiplexers is electrically connected to at most two of every three adjacent touch electrodes in a touch display substrate.

By electrically connecting a single multiplexer 100 in the integrated circuit chip to at most two of every three adjacent touch electrodes in the touch display substrate, the data of a plurality of touch electrodes in the touch area can be simultaneously processed by a plurality of different multiplexers 100 when the toucher touches the display device including the above touch display substrate, thereby effectively improving the touch response speed, touch calculation efficiency and reporting rate, and also reducing the noise difference between adjacent touch electrodes and improving the control accuracy.

Figure 17:
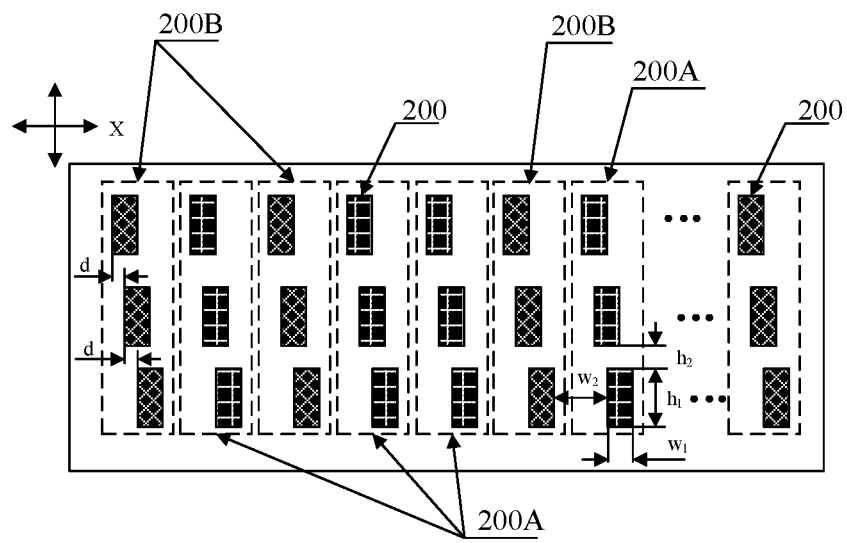
FIG. 17 is a schematic structural diagram of another integrated circuit chip according to an embodiment of the disclosure.

Referring to FIG. 17, FIG. 17 is a schematic diagram of pin distribution of another integrated circuit chip according to an embodiment of the disclosure, the integrated circuit chip further includes: a plurality of output pins 200 arranged in rows and columns and divided into: display output pins 200A for bonding with display bonding pins, and touch output pins 200B for bonding with touch bonding pins. The touch output pins 200B and the display output pins 200A are mixedly arranged in each row of the output pins 200. In each column of the output pins 200, the output pins are sequentially offset by a set distance d in a row direction X, and the output pins 200 in one column are all the display output pins 200A or the touch output pins 200B.

The arrangement, pin size and spacing of the output pins 200 in the integrated circuit chip are the same as the arrangement, pin size and spacing of the first bonding pins in the above-mentioned touch display substrate, and will not be repeated here.

In a possible embodiment, in each row of the output pins 200, a quantity of the display output pins 200A is greater than a quantity of the touch output pins 200B, and at least one display output pin 200A is arranged between two adjacent touch output pins 200B.

In a possible embodiment, each row of the output pins 200 includes a plurality of repeating groups arranged circularly, and a quantity ratio of the display output pins 200A to the touch output pins 200B in one repeating group is identical to a total quantity ratio of the display bonding pins to the touch bonding pins.

Figure 18:
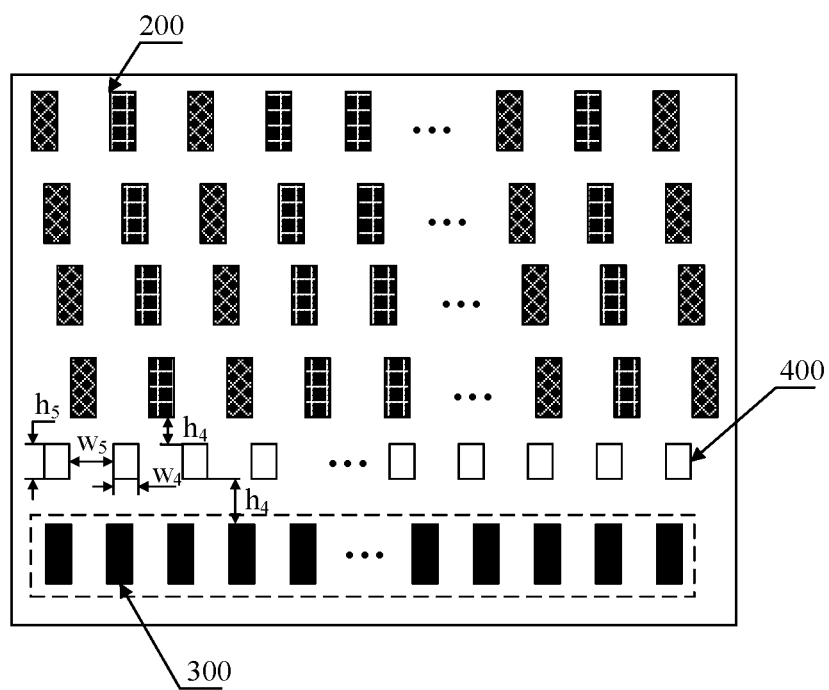
FIG. 18 is a schematic structural diagram of another integrated circuit chip according to an embodiment of the disclosure.

Referring to FIG. 18, FIG. 18 is a schematic structural diagram of another integrated circuit chip according to an embodiment of the disclosure, the integrated circuit chip further includes: at least one row of input pins 300, and at least one row of second floating pins 400 located in an area between the input pins 300 and the output pins 200. The output pins 200, the input pins 300, and the second floating pins 400 are arranged correspondingly to the first bonding pins, the second bonding pins and the first floating pins in the above-mentioned touch display substrate. The second floating pins 400 are configured to fill and support the space between the input pins 300 and the output pins 200.

A width and length of the second floating pin 400 are $w_4$ and $h_5$, and a value range of $w_4$ and $h_5$ is 40 to 60 um. For example, the width and length of the second floating pin 400 may be identical, such as 50 μm, or may be different, for example, one is 45 um and the other is 55 um, which is not limited. A distance between two adjacent second floating pins 400 is $w_5$, and a value range of $w_5$ is 140 to 160 um, and for example, may be set to 150 um. A distance between the second floating pin 400 and the output pin 200, and a distance between the second floating pin 400 and the input pin 300 are both $h_4$. A value range of $h_4$ is 250 to 270 μm, and for example, may be set to 260 um.

It should be understood that the first floating pins in the above-mentioned display touch substrate and the second floating pins 400 have the same size, but are not arranged at the same time. For example, if the first floating pins are arranged in the display touch substrate, the second floating pins 400 may not arranged in the integrated circuit chip: if the second floating pins 400 are arranged in the integrated circuit chip, the first floating pins may not be arranged in the display touch substrate.

In an embodiment provided by the disclosure, by arranging at least one row of second floating pins 400 in the area between the input pins 300 and the output pins 200, the space between the input pins 300 and the output pins 200 may be filled and supported by the second floating pins 400, to prevent the middle part of the integrated circuit chip from being sunken to cause poor bonding, and thus improve the bonding yield.

Figure 19:
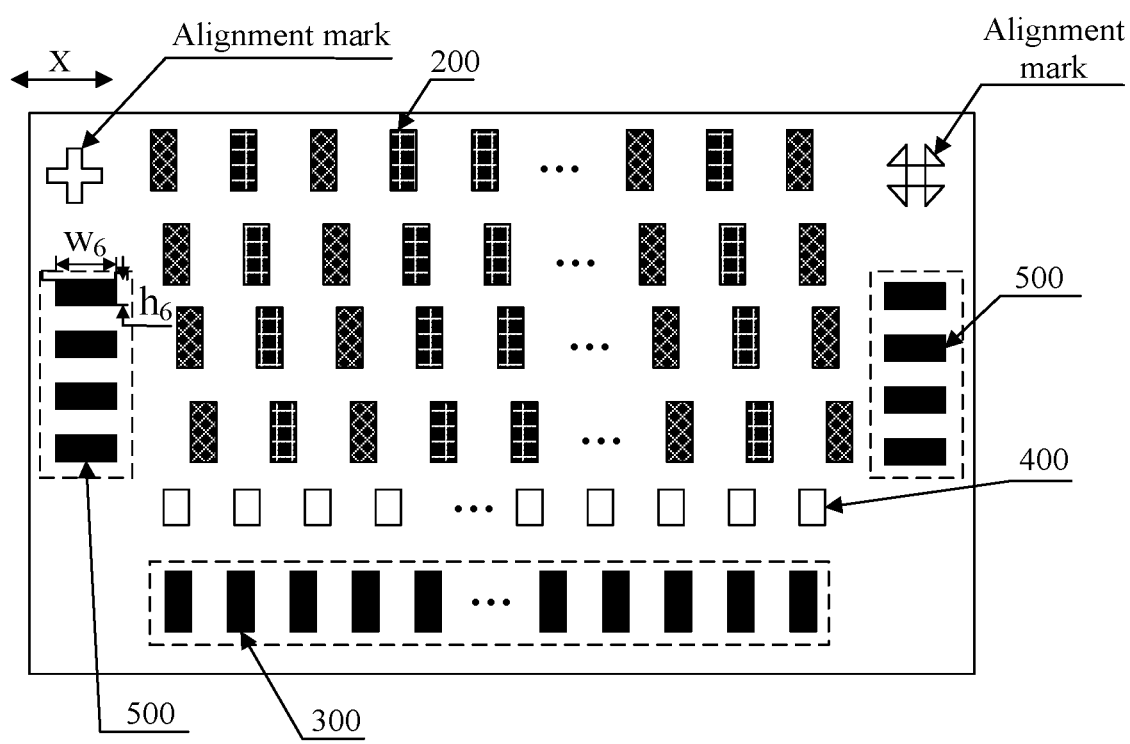
FIG. 19 is a schematic structural diagram of another integrated circuit chip according to an embodiment of the disclosure.

Referring to FIG. 19, FIG. 19 is a schematic structural diagram of another integrated circuit chip according to an embodiment of the disclosure, the integrated circuit chip further includes: two columns of power supply pins 500 arranged on both sides of a plurality of rows of input pins 300 in the row direction X, for supplying power to the integrated circuit chip.

A width and length of the power supply pin 500 are $w_6$ and $h_6$. A value range of $w_6$ is 70 to 90 um, and for example, may be set to 8 um; and a value range of $h_6$ is 15 um to 25 um, and for example, may be set to 20 um.

In an embodiment provided by the disclosure, the power supply pins 500 are arranged on both sides of a plurality of rows of input pins 300 in the row direction X, and may be connected to a flexible circuit board through both sides of the integrated circuit chip, thereby effectively saving the wiring space from the integrated circuit chip to the flexible circuit board.

Two alignment marks of the same shape or different shapes may also be set in the above-mentioned integrated circuit chip, and these two alignment marks are set above two columns of power supply pins 500 for alignment when bonding in the chip area of the touch display substrate.

Based on the same inventive concept, an embodiment of the disclosure provides a display device, the display device includes: the touch display substrate as described above.

In a possible embodiment, the display device further includes: at least one integrated circuit chip as described above. The integrated circuit chip is bonded to the bonding area of the touch display substrate.

The display device may be a liquid crystal display, a liquid crystal display screen, a liquid crystal television or other display device, or may be a mobile phone, a tablet computer, a notebook or other mobile device.

Although embodiments of the disclosure have been described, those skilled in the art can make additional alterations and modifications to these embodiments once they learn about the basic creative concepts. Thus, the attached claims are intended to be interpreted to include embodiments as well as all the alterations and modifications falling within the scope of the disclosure.

Evidently those skilled in the art can make various modifications and variations to the disclosure without departing from the spirit and scope of the disclosure. Thus the disclosure is also intended to encompass these modifications and variations to the disclosure as long as these modifications and variations come into the scope of the claims of the disclosure and their equivalents.

What is claimed is:

1. A touch display substrate with an active area and a lead area arranged in sequence, comprising:
   a plurality of touch lines arranged in the active area;
   a plurality of touch leads, each of the touch leads being electrically connected to at least one touch line;
   a plurality of touch electrodes arranged in an array in the active area, each of the touch electrodes being coupled to at least one touch line;
   wherein at least two of every three adjacent touch electrodes are connected to different multiplexers through coupled touch lines and touch leads;
   wherein in the array comprising the plurality of touch electrodes, each column of the array comprises a plurality of touch electrode groups, each of the plurality of touch electrode groups comprises at most M touch electrodes, M is a total quantity of data channels of a multiplexer, and at most two touch electrodes in one of the plurality of touch electrode groups are electrically connected to a same multiplexer.

2. The touch display substrate according to claim 1, wherein the touch display substrate is connected with a touch and display driver integration chip, and the multiplexers are located in the touch and display driver integration chip, or the multiplexers are located in the touch display substrate.

3. The touch display substrate according to claim 1, wherein the touch display substrate further comprises a plurality of data lines arranged in the active area, and a plurality of data leads arranged in the lead area; and the touch substrate further comprises a bonding area located on a side of the lead area away from the active area and comprising at least one chip area, the chip area comprises:
a plurality of first bonding pins arranged in rows and columns and divided into: display bonding pins coupled to the data lines through the data leads, and touch bonding pins coupled to the touch lines through the touch leads;
wherein the touch bonding pins and the display bonding pins are mixedly arranged in each row of the first bonding pins;
in each column of the first bonding pins, the first bonding pins are sequentially offset by a set distance in a row direction, and the first bonding pins in a same column are all the display bonding pins or the touch bonding pins.

4. The touch display substrate according to claim 3, wherein, in each row of the first bonding pins, a quantity of the display bonding pins is greater than a quantity of the touch bonding pins, and at least one display bonding pin is arranged between two adjacent touch bonding pins.

5. The touch display substrate according to claim 4, wherein each row of the first bonding pins comprises a plurality of repeating groups arranged circularly, and a quantity ratio of the display bonding pins to the touch bonding pins in one repeating group is identical to a quantity ratio of the data leads to the touch leads in the lead area.

6. The touch display substrate according to claim 3, wherein data leads and touch leads coupled to the first bonding pins in a same row are located in a same metal layer, and data leads and touch leads coupled to the first bonding pins in two adjacent rows are located in different metal layers.

7. The touch display substrate according to claim 6, wherein the touch leads and the data leads are located in a source-drain metal layer or a gate metal layer.

8. The touch display substrate according to claim 6, wherein, data leads and touch leads located in different metal layers overlap with each other in the lead area, and data leads and touch leads located in different metal layers and passing through two adjacent first bonding pins do not overlap with each other in the bonding area.

9. The touch display substrate according to claim 3, wherein a data lead or touch lead located in the lead area comprises an oblique line segment and a serpentine line segment, the serpentine line segment extends from the bonding area to one end of the oblique line segment, and another end of the oblique line segment is connected to a corresponding data line or touch line.

10. The touch display substrate according to claim 3, wherein the bonding area comprises four rows of the first bonding pins.

11. The touch display substrate according to claim 10, wherein the chip area further comprises:
at least one row of second bonding pins, and at least one row of first floating pins located in an area between the second bonding pins and the first bonding pins, wherein the first floating pins are configured to support the touch and display driver integration chip bonded in the chip area.

12. An integrated circuit chip, comprising:
a plurality of multiplexers, wherein each of the multiplexers is electrically connected to at most two of every three adjacent touch electrodes in a touch display substrate;
wherein the touch display substrate has an active area and a lead area arranged in sequence, and the touch display substrate comprises:
a plurality of touch lines arranged in the active area;
a plurality of touch leads, each of the touch leads being electrically connected to at least one touch line;
a plurality of touch electrodes arranged in an array in the active area, each of the touch electrodes being coupled to at least one touch line;
wherein at least two of every three adjacent touch electrodes are connected to different multiplexers through coupled touch lines and touch lead;
wherein in the array comprising the plurality of touch electrodes, each column of the array comprises a plurality of touch electrode groups, each of the plurality of touch electrode groups comprises at most M touch electrodes, M is a total quantity of data channels of a multiplexer, and at most two touch electrodes in one of the plurality of touch electrode groups are electrically connected to a same multiplexer.

13. The integrated circuit chip according to claim 12, further comprising:
a plurality of output pins arranged in rows and columns and divided into: display output pins for bonding with display bonding pins, and touch output pins for bonding with touch bonding pins;
wherein the touch output pins and the display output pins are mixedly arranged in each row of the output pins;
in each column of the output pins, the output pins are sequentially offset by a set distance in a row direction, and the output pins in one column are all the display output pins or the touch output pins.

14. The integrated circuit chip according to claim 13, wherein, in each row of the output pins, a quantity of the display output pins is greater than a quantity of the touch output pins, and at least one display output pin is arranged between two adjacent touch output pins.

15. The integrated circuit chip according to claim 14, wherein each row of the output pins comprises a plurality of repeating groups arranged circularly, and a quantity ratio of the display output pins to the touch output pins in one repeating group is identical to a total quantity ratio of the display output pins to the touch output pins.

16. The integrated circuit chip according to claim 12, wherein the integrated circuit chip further comprises:
at least one row of input pins, and at least one row of second floating pins located in an area between the input pins and the output pins.

17. A display device, comprising:
a touch display substrate with an active area and a lead area arranged in sequence, the touch display substrate comprising:

a plurality of touch lines arranged in the active area;

a plurality of touch leads, each of the touch leads being electrically connected to at least one touch line;

a plurality of touch electrodes arranged in an array in the active area, each of the touch electrodes being coupled to at least one touch line;

wherein at least two of every three adjacent touch electrodes are connected to different multiplexers through coupled touch lines and touch lead;

wherein in the array comprising the plurality of touch electrodes, each column of the array comprises a plurality of touch electrode groups, each of the plurality of touch electrode groups comprises at most M touch electrodes, M is a total quantity of data channels of a multiplexer, and at most two touch electrodes in one of the plurality of touch electrode groups are electrically connected to a same multiplexer.

18. The display device according to claim 17, further comprising:

at least one integrated circuit chip, the integrated circuit chip comprising:

a plurality of multiplexers, wherein each of the multiplexers is electrically connected to at most two of every three adjacent touch electrodes in the touch display substrate; wherein the integrated circuit chip is bonded to a bonding area of the touch display substrate.

\* \* \* \* \*